United States Patent
Zhang et al.

(10) Patent No.: US 11,082,073 B2
(45) Date of Patent: Aug. 3, 2021

(54) METHOD AND CONTROLLER FOR CONTROLLING POWER AMPLIFIER IN RADIO TRANSMITTER AS WELL AS RADIO UNIT AND RADIO DEVICE

(71) Applicant: Telefonaktiebolaget LM Ericsson (publ), Stockholm (SE)

(72) Inventors: Yang Zhang, Beijing (CN); Peng Liu, Beijing (CN); Qiaoyu Li, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/500,169

(22) PCT Filed: Jun. 5, 2017

(86) PCT No.: PCT/CN2017/087163
§ 371 (c)(1),
(2) Date: Oct. 2, 2019

(87) PCT Pub. No.: WO2018/223256
PCT Pub. Date: Dec. 13, 2018

(65) Prior Publication Data
US 2020/0280325 A1   Sep. 3, 2020

(51) Int. Cl.
*H04B 1/04* (2006.01)
*H03F 1/02* (2006.01)
(Continued)

(52) U.S. Cl.
CPC ......... *H04B 1/0475* (2013.01); *H03F 1/0211* (2013.01); *H03F 1/32* (2013.01);
(Continued)

(58) Field of Classification Search
CPC . H04B 1/0475; H04B 2001/0408; H03F 3/24; H03F 1/0211; H03F 1/32; H03F 2200/105; H03F 2200/451
See application file for complete search history.

(56) References Cited

U.S. PATENT DOCUMENTS

| 4,336,615 A | 6/1982 | Abt et al. |
| 2007/0178856 A1 | 8/2007 | Mitzlaff et al. |

(Continued)

FOREIGN PATENT DOCUMENTS

| CN | 106230445 A | 12/2016 |
| GB | 2432271 A | 5/2007 |

OTHER PUBLICATIONS

International Search Report and Written Opinion for International Patent Application No. PCT/CN2017/087163, dated Mar. 7, 2018, 10 pages.
(Continued)

*Primary Examiner* — Kabir A Timory
(74) *Attorney, Agent, or Firm* — Withrow & Terranova, PLLC

(57) ABSTRACT

Method and controller are disclosed for controlling a power amplifier in a radio transmitter. According to an embodiment, a nonlinearity of the power amplifier is determined. A supply voltage to the power amplifier is controlled based on the determined nonlinearity. A radio unit comprising the radio transmitter and a radio device comprising the radio unit are also disclosed.

13 Claims, 5 Drawing Sheets

(51) Int. Cl.
*H03F 1/32* (2006.01)
*H03F 3/24* (2006.01)

(52) U.S. Cl.
CPC ......... *H03F 3/24* (2013.01); *H03F 2200/105* (2013.01); *H03F 2200/451* (2013.01); *H04B 2001/0408* (2013.01)

(56) References Cited

U.S. PATENT DOCUMENTS

| | | | |
|---|---|---|---|
| 2012/0194271 A1* | 8/2012 | Yamamoto | H04B 1/0475 330/149 |
| 2013/0147538 A1 | 6/2013 | Oh et al. | |
| 2013/0257545 A1 | 10/2013 | Jeon et al. | |
| 2016/0197627 A1 | 7/2016 | Qin et al. | |
| 2017/0052553 A1* | 2/2017 | Gebeyehu | G05F 1/575 |

OTHER PUBLICATIONS

Ranjan, M., et al., "Microwave Power Amplifiers with Digitally-Controlled Power Supply Voltage for High Efficiencey and High Linearity," Microwave Symposium Digest, MTT-S Digest, 2000, IEEE, pp. 493-496.

Extended European Search Report for European Patent Application No. 17912959.8, dated Oct. 15, 2020, 9 pages.

* cited by examiner

METHOD AND CONTROLLER FOR CONTROLLING POWER AMPLIFIER IN RADIO TRANSMITTER AS WELL AS RADIO UNIT AND RADIO DEVICE

TECHNICAL FIELD

Embodiments of the disclosure generally relate to radio technologies, and, more particularly, to method and controller for controlling power amplifier in radio transmitter as well as radio unit and radio device.

BACKGROUND

In remote radio unit (RRU) for wireless communication, more than 60% power is consumed by power amplifier (PA). Thus, the energy efficiency of PA is important to the overall energy efficiency of RRU. One of the most effective methods to improve the energy efficiency of PA is to reduce its voltage. However, within a certain voltage range, by reducing PA's voltage, the nonlinearity of PA increases and the radio performance degrades. Therefore, it would be desirable to make an optimum tradeoff between the efficiency and linearity for PA design.

SUMMARY

This summary is provided to introduce a selection of concepts in a simplified form that are further described below in detailed description. This summary is not intended to identify key features or essential features of the claimed subject matter, nor is it intended to be used to limit the scope of the claimed subject matter.

One of the objects of the disclosure is to provide a solution for controlling a power amplifier (PA) in a radio transmitter to achieve an optimum tradeoff between the efficiency and linearity of the PA.

According to one aspect of the disclosure, it is provided a method for controlling a PA in a radio transmitter. The method comprises determining a nonlinearity of the PA. The method further comprises controlling a supply voltage to the PA based on the determined nonlinearity.

In an embodiment of the disclosure, the step of controlling comprises comparing the determined nonlinearity with a first threshold. The step of controlling further comprises decreasing the supply voltage in response to a comparison result that the determined nonlinearity is smaller than the first threshold. The step of controlling further comprises increasing the supply voltage in response to a comparison result that the determined nonlinearity is greater than or equal to the first threshold.

In an embodiment of the disclosure, the step of controlling comprises comparing the determined nonlinearity with a second and a third thresholds. The step of controlling further comprises decreasing the supply voltage in response to a comparison result that the determined nonlinearity is smaller than the second threshold. The step of controlling further comprises keeping the supply voltage unchanged in response to a comparison result that the determined nonlinearity is greater than or equal to the second threshold and smaller than the third threshold. The step of controlling further comprises increasing the supply voltage in response to a comparison result that the determined nonlinearity is greater than or equal to the third threshold.

In an embodiment of the disclosure, the step of controlling comprises comparing the determined nonlinearity with a fourth and a fifth thresholds. The fifth threshold is greater than the fourth threshold. The step of controlling further comprises, once the determined nonlinearity falls below the fourth threshold, decreasing the supply voltage until the determined nonlinearity rises above a sixth threshold that lies between the fourth and fifth thresholds. The step of controlling further comprises, once the determined nonlinearity rises above the fifth threshold, increasing the supply voltage until the determined nonlinearity falls below the sixth threshold. The step of controlling further comprises, when the determined nonlinearity lies between the fourth and fifth thresholds initially or after the step of decreasing or increasing, keeping the supply voltage unchanged.

In an embodiment of the disclosure, an increasing amount of the supply voltage in the step of increasing is greater than or equal to a decreasing amount of the supply voltage in the step of decreasing.

In an embodiment of the disclosure, the step of controlling is performed with different control parameters for different radio carrier setups.

In an embodiment of the disclosure, the nonlinearity is indicated by at least one of: a correction value that is applied by a digital component in the radio transmitter to an input signal to compensate the nonlinearity; and an error vector magnitude (EVM) or an amplitude-amplitude (AM-AM) characteristic between the input signal and the output signal of the digital component.

According to another aspect of the disclosure, it is provided a controller for controlling a PA in a radio transmitter. The controller comprises a processor and a memory. The memory contains instructions executable by the processor, whereby the controller is operative to determine a nonlinearity of the PA. The controller is further operative to control a supply voltage to the PA based on the determined nonlinearity.

In an embodiment of the disclosure, the instructions are executable by the processor, whereby the controller is operative to perform the step of controlling by comparing the determined nonlinearity with a first threshold. The controller is operative to perform the step of controlling by decreasing the supply voltage in response to a comparison result that the determined nonlinearity is smaller than the first threshold. The controller is operative to perform the step of controlling by increasing the supply voltage in response to a comparison result that the determined nonlinearity is greater than or equal to the first threshold.

In an embodiment of the disclosure, the instructions are executable by the processor, whereby the controller is operative to perform the step of controlling by comparing the determined nonlinearity with a second and a third thresholds. The controller is operative to perform the step of controlling by decreasing the supply voltage in response to a comparison result that the determined nonlinearity is smaller than the second threshold. The controller is operative to perform the step of controlling by keeping the supply voltage unchanged in response to a comparison result that the determined nonlinearity is greater than or equal to the second threshold and smaller than the third threshold. The controller is operative to perform the step of controlling by increasing the supply voltage in response to a comparison result that the determined nonlinearity is greater than or equal to the third threshold.

In an embodiment of the disclosure, the instructions are executable by the processor, whereby the controller is operative to perform the step of controlling by comparing the determined nonlinearity with a fourth and a fifth thresholds. The fifth threshold is greater than the fourth threshold. The controller is operative to perform the step of controlling by, once the determined nonlinearity falls below the fourth threshold, decreasing the supply voltage until the determined nonlinearity rises above a sixth threshold that lies between the fourth and fifth thresholds. The controller is operative to perform the step of controlling by, once the determined nonlinearity rises above the fifth threshold, increasing the supply voltage until the determined nonlinearity falls below the sixth threshold. The controller is operative to perform the step of controlling by, when the determined nonlinearity lies between the fourth and fifth thresholds initially or after the step of decreasing or increasing, keeping the supply voltage unchanged.

In an embodiment of the disclosure, the instructions are executable by the processor, whereby the controller is operative to perform the step of controlling with different control parameters for different radio carrier setups.

In an embodiment of the disclosure, the instructions are executable by the processor, whereby the controller is operative to perform the steps of determining and controlling regularly or irregularly.

According to another aspect of the disclosure, it is provided a radio transmitter. The radio transmitter comprises a PA. The radio transmitter further comprises a direct current (DC) converter configured to apply a supply voltage to the PA. The radio transmitter further comprises a PA monitor configured to monitor an output from the PA. The radio transmitter further comprises a digital component configured to determine a correction value based on a feedback from the PA monitor and apply the correction value to an input signal to compensate a nonlinearity of the PA. The radio transmitter further comprises a digital to analog converter (DAC) configured to convert the corrected input signal to an analog signal. The radio transmitter further comprises an analog component configured to perform up-conversion on the analog signal for subsequent amplification by the PA. The radio transmitter further comprises the controller according to the above aspect. The controller is coupled between the digital component and the DC converter, or is embedded in the digital component or the DC converter.

According to another aspect of the disclosure, it is provided a radio unit (RU) for a radio device. The RU comprises the radio transmitter according to the above aspect.

According to another aspect of the disclosure, it is provided a radio device. The radio device comprises the RU according to the above aspect.

In an embodiment of the disclosure, the radio device is one of a base station, a mobile phone, or a radar.

According to another aspect of the disclosure, it is provided a computer program product. The computer program product comprises instructions which when executed by at least one processor, cause the at least one processor to perform the method according to the above aspect.

According to another aspect of the disclosure, it is provided a computer readable storage medium. The computer readable storage medium comprises instructions which when executed by at least one processor, cause the at least one processor to perform the method according to the above aspect.

According to another aspect of the disclosure, it is provided a controller for controlling a PA in a radio transmitter. The controller comprises a determination module for determining a nonlinearity of the PA. The controller further comprises a control module for controlling a supply voltage to the PA based on the determined nonlinearity.

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 1:
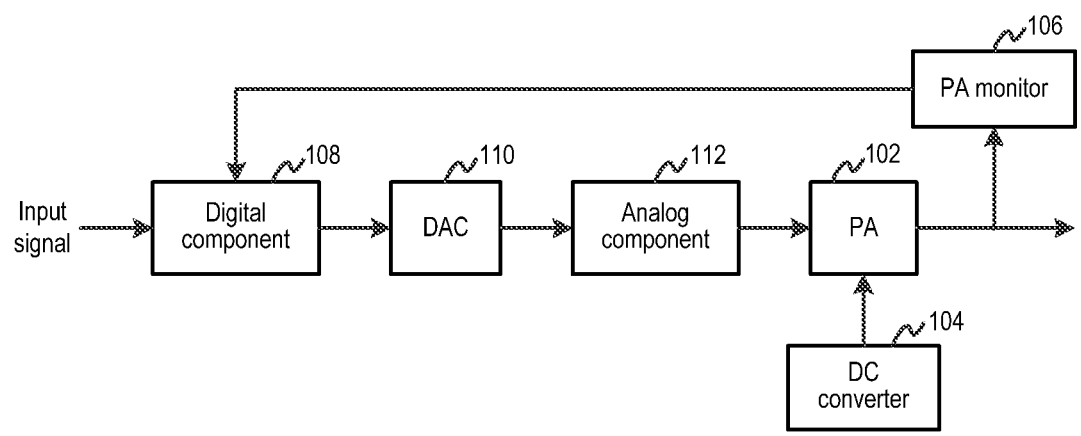
FIG. 1 is a block diagram showing a traditional radio transmitter.

FIG. 1 is a block diagram showing a traditional radio transmitter. It may be a part of a RRU, for example. As shown, the radio transmitter comprises a power amplifier (PA) 102, a direct current (DC) converter 104, a PA monitor 106, a digital component 108, a digital to analog converter (DAC) 110 and an analog component 112.

The DC converter 104 provides a constant DC voltage to the PA 102. The PA monitor 106 is used to measure the PA 102's output. The measurement is sent to the digital component 108, which is usually an application specific integrated circuit (ASIC) or a field programmable gate array (FPGA). The digital component 108 estimates the PA nonlinearity and adds an additional correction to the original input signal to compensate against the PA nonlinearity. If the PA nonlinearity is below an upper limit, the additional correction can secure the radio performance. If the PA nonlinearity exceeds the upper limit, the digital component 108 will fail to compensate and the radio performance will no longer meet the requirement. The DAC 110 converts the corrected input signal to an analog signal. The analog component 112 performs up-conversion on the analog signal for subsequent amplification by the PA 102. It should be noted that FIG. 1 is simplified for conciseness. Each block could comprise more than one component. For example, the analog component 112 could comprise several up-conversion components, and some auxiliary amplifiers and filters.

As mentioned hereinbefore, the tradeoff between the efficiency and linearity is critical for the PA design. In the above traditional radio transmitter, a few volts are kept as a voltage margin to cover all variations in mass production and from aging effects, thereby achieving acceptable linearity. However, this is not favorable for energy efficiency because of the following reasons.

Firstly, the voltage margin cannot be eliminated during production, since the aging behavior is not deterministic. Secondly, in mass production, the voltage margin is employed in all products. But in fact, the worst case can only be reached by a small portion of the PA products. For most PAs, the margin results in energy wastes. Thirdly, during operation, only a small portion of carrier setups needs a full voltage. Most of times, voltage margin is purely waste.

The present disclosure proposes a solution for controlling a power amplifier in a radio transmitter dynamically. Hereinafter, the solution will be described in detail with reference to FIGS. 2-7.

Figure 2:
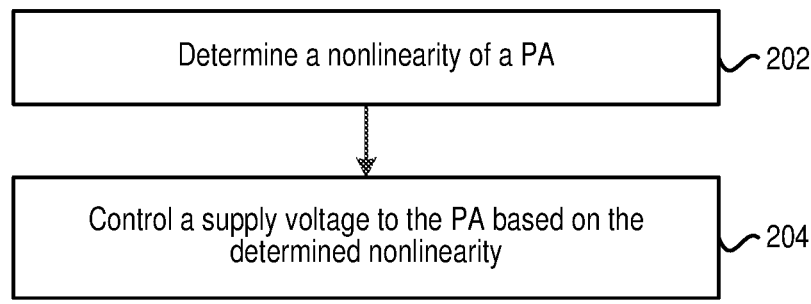
FIG. 2 is a flowchart illustrating a method for controlling a power amplifier according to an embodiment of the disclosure.

FIG. 2 is a flowchart illustrating a method for controlling a PA in a radio transmitter according to an embodiment of the disclosure. The method may be performed by a controller. At step 202, a nonlinearity of the PA is determined. As an example, the nonlinearity can be indicated by a correction value that is applied by a digital component in the radio transmitter to an input signal to compensate the nonlinearity. The digital component may be similar to the digital component 108 of FIG. 1. It may be implemented as a digital pre-distortion (DPD) circuit and the correction value may be generated by using various DPD algorithms. In this case, the controller can obtain from the digital component the correction value as the nonlinearity of the PA.

Figure 3:
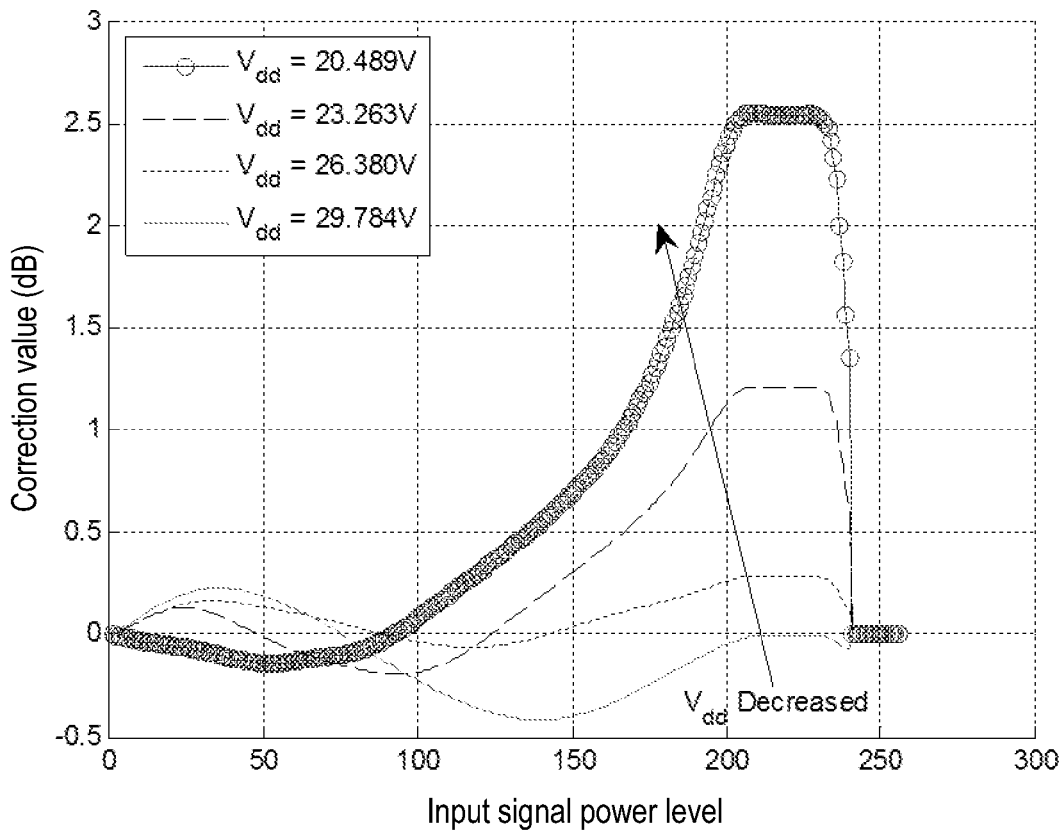
FIG. 3 shows characteristic curves for a power amplifier under different supply voltages.

FIG. 3 shows characteristic curves for a PA under different supply voltages. The horizontal axis represents the power level of the input signal and the vertical axis represents the correction value. There are shown four curves corresponding to different supply voltages $V_{dd}$ applied to the PA. As shown, there is a good correlation between the correction value and the supply voltage $V_{dd}$. For example, in the range [125, 200] of the input signal power, as the $V_{dd}$ decreases, the correction value increases. As mentioned hereinbefore, as the $V_{dd}$ decreases, the PA nonlinearity also increases. Thus, the correction value can be used as a metric for indicating the PA nonlinearity.

As another example, the nonlinearity can be indicated by an error vector magnitude (EVM) or an amplitude-amplitude (AM-AM) characteristic between the input signal and an output signal of the digital component. In this case, the controller can measure the input and output signals of the digital component and calculate the EVM or AM-AM characteristic between the input and output signals. Those skilled in the art can understand that any other suitable metric capable of indicating the PA nonlinearity can also be employed.

At step 204, a supply voltage to the PA is controlled based on the determined nonlinearity. For example, the supply voltage is applied to the PA by a DC converter and can be controlled by the controller by sending a control signal to the DC converter.

Figure 4:
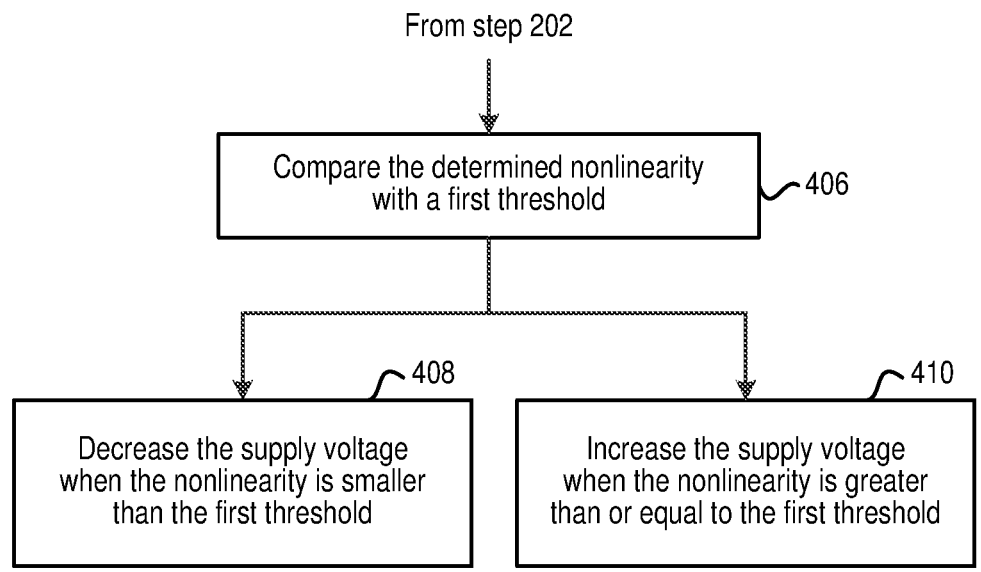
FIG. 4 is a flowchart for explaining the method of FIG. 2.

As an example, step 204 may be implemented as steps 406-410 as shown in FIG. 4. At step 406, the determined nonlinearity is compared with a first threshold. The first threshold may correspond to the maximum nonlinearity that can be compensated by the digital component. It may be predetermined off-line for the PA and the corresponding hardware architecture of the radio transmitter.

In the example shown in FIG. 3, the maximum nonlinearity can be indicated by the maximum correction value 2.5 dB. This value may be taken as the first threshold. When the correction value is below 2.5 dB, the digital component is able to provide corrections to secure the radio performance such as adjacent channel leakage ratio (ACLR) and EVM performance. When the correction value exceeds 2.5 dB, the digital component is no longer able to correct the nonlinearity and the ACLR/EVM performance no longer meets the requirement. Alternatively, in order to keep necessary linearity margin, a value (e.g., 2.4 dB) that is slightly smaller than the maximum correction value may be taken as the first threshold.

In response to a comparison result that the determined nonlinearity is smaller than the first threshold, the supply voltage is decreased at step 408. In this way, when there is still PA linearity margin, the PA voltage can be reduced. Although the unfavorable PA nonlinearity will be increased, but it can be compensated by the correction from the digital component. Thus, the energy efficiency of the PA can be increased without degrading its radio performance.

On the other hand, in response to a comparison result that the determined nonlinearity is greater than or equal to the first threshold, the supply voltage is increased at step 410. In this way, when there is not enough PA linearity margin, the PA voltage can be increased to a safer value that can secure the radio performance.

Figure 5:
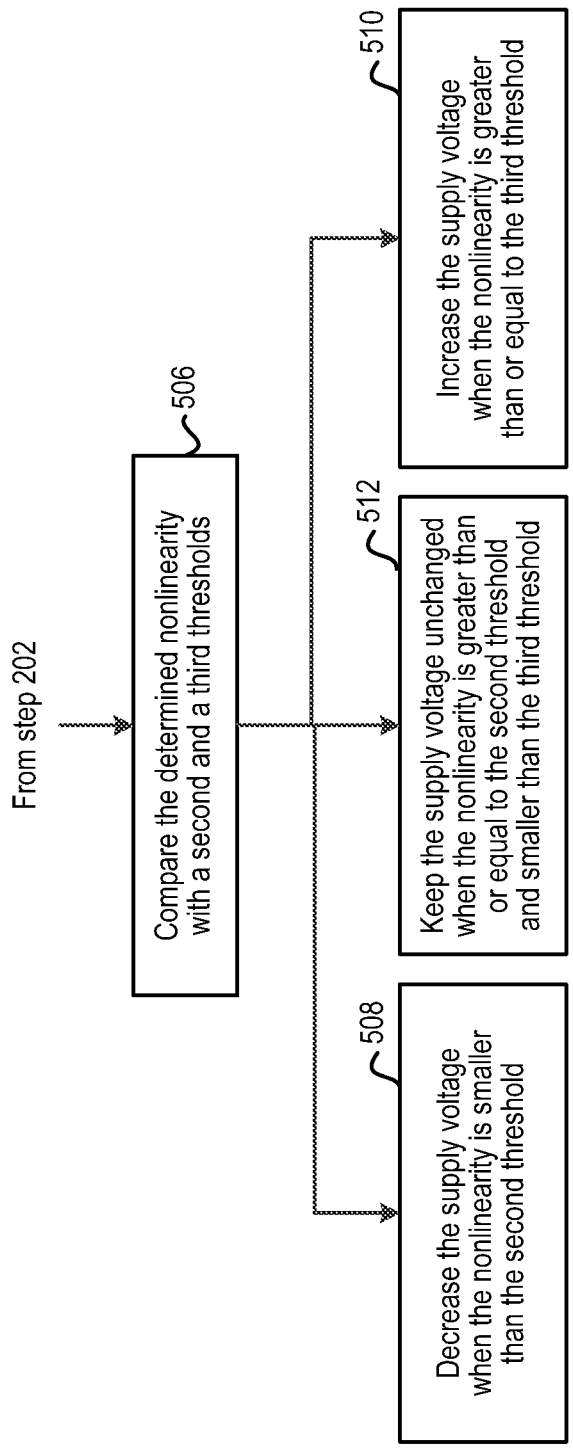
FIG. 5 is another flowchart for explaining the method of FIG. 2.

As another example, step 204 may be implemented as steps 506-510 as shown in FIG. 5. At step 506, the determined nonlinearity is compared with a second and a third thresholds. The third threshold may be similar to the first threshold. The second threshold is smaller than the third threshold. The difference between the second and third thresholds may be determined off-line for the PA and the corresponding hardware architecture of the radio transmitter, so as to achieve an optimum tradeoff between the stableness and energy efficiency.

In response to a comparison result that the determined nonlinearity is smaller than the second threshold, the supply voltage is decreased at step 508. This step may be similar to step 408. In response to a comparison result that the determined nonlinearity is greater than or equal to the third threshold, the supply voltage is increased at step 510. This step may be similar to step 410. In response to a comparison result that the determined nonlinearity is greater than or equal to the second threshold and smaller than the third threshold, the supply voltage is kept unchanged at step 512. In this way, frequent switching between the voltage decreasing step and the voltage increasing step can be avoided.

Figure 6:
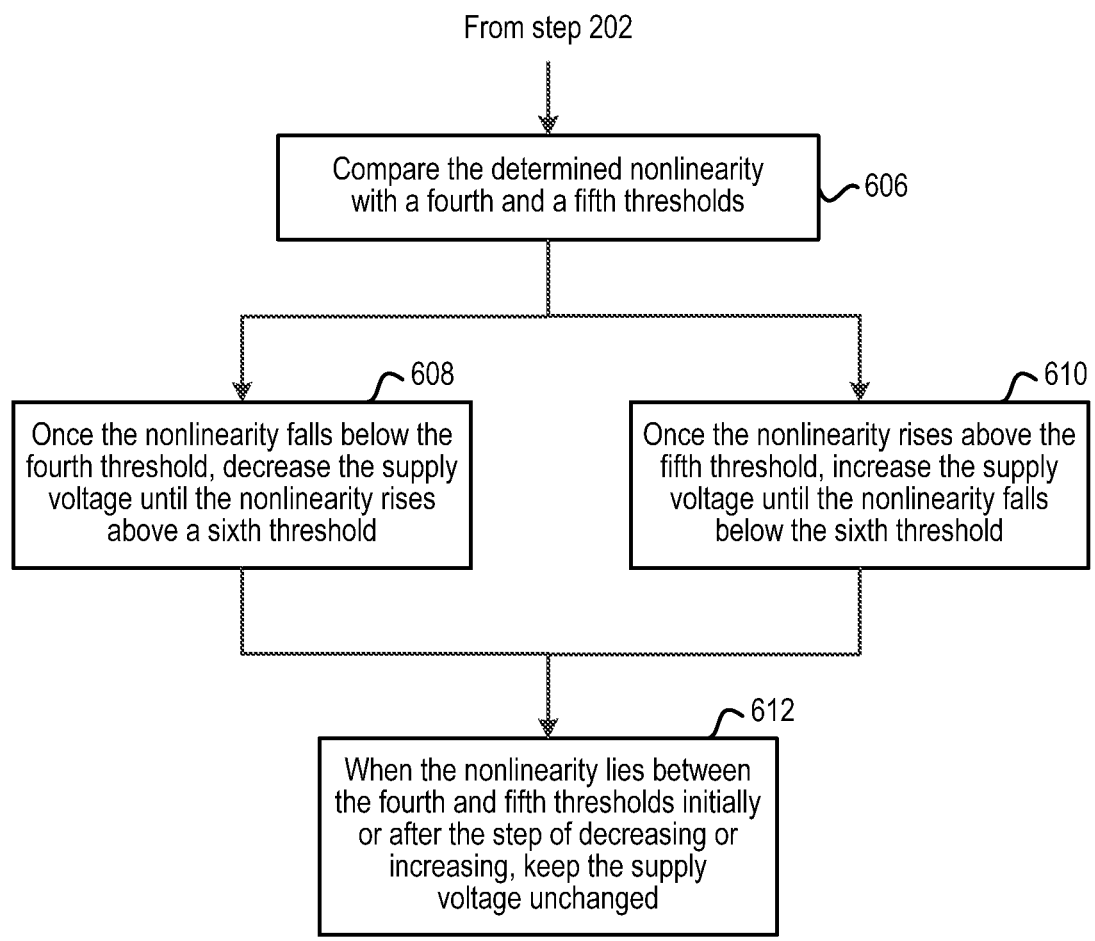
FIG. 6 is still another flowchart for explaining the method of FIG. 2.

As still another example, step 204 may be implemented as steps 606-612 as shown in FIG. 6. At step 606, the determined nonlinearity is compared with a fourth and a fifth thresholds. The fifth threshold may be similar to the first threshold. The fourth threshold is smaller than the fifth threshold. The difference between the fourth and fifth thresholds may be determined off-line for the PA and the corresponding hardware architecture of the radio transmitter, so as to achieve an optimum tradeoff between the stableness and energy efficiency.

At step 608, once the determined nonlinearity falls below the fourth threshold, the supply voltage is decreased until the determined nonlinearity rises above (e.g., greater than or equal to) a sixth threshold that lies between the fourth and fifth thresholds. That is, the supply voltage may be decreased one or more times in a predetermined regular or irregular time interval. Since the supply voltage is decreased, the PA nonlinearity is increased. Once the PA nonlinearity rises above the sixth threshold, the supply voltage is stopped to be decreased.

Similar to the fourth threshold, the sixth threshold may be determined off-line for the PA and the corresponding hardware architecture of the radio transmitter, so as to achieve an optimum tradeoff between the stableness and energy efficiency.

At step 610, once the determined nonlinearity rises above the fifth threshold, the supply voltage is increased until the determined nonlinearity falls below (e.g., smaller than or equal to) the sixth threshold. That is, the supply voltage may be increased one or more times in a predetermined regular or irregular time interval. Since the supply voltage is increased, the PA nonlinearity is decreased. Once the PA nonlinearity falls below the sixth threshold, the supply voltage is stopped to be increased.

Then, at step 612, when the determined nonlinearity lies between the fourth and fifth thresholds initially or after the step of decreasing or increasing, the supply voltage is kept unchanged.

That is, during the first regular or irregular period for performing the method of FIG. 6, the determined nonlinearity may be: (1) smaller than the fourth threshold, or (2) greater than or equal to the fifth threshold, or (3) greater than or equal to the fourth threshold and smaller than the fifth threshold.

In response to the case (1), step 608 is performed. Afterwards, since the PA nonlinearity lies between the fourth and fifth thresholds, step 612 is performed until the PA nonlinearity satisfies the case (1) or (2) again. In response to the case (2), step 610 is performed. Afterwards, since the PA nonlinearity lies between the fourth and fifth thresholds, step 612 is performed until the PA nonlinearity satisfies the case (1) or (2) again. In response to the case (3), step 612 is performed until the PA nonlinearity satisfies the case (1) or (2) again. In this way, the voltage disturbance can be further reduced by adding two hysteresis windows.

Optionally, an increasing amount of the supply voltage in steps 410, 510 and 610 is greater than or equal to a decreasing amount of the supply voltage in steps 408, 508 and 608. In this way, a more stable performance can be provided due to the smaller decreasing amount, while the radio performance can be secured in a short time due to the greater increasing amount.

Optionally, step 204 is performed with different control parameters for different radio carrier setups. For example, with respect to global system for mobile communication (GSM) and long term evolution (LTE) carrier setups, different control parameters (e.g., the thresholds) are used for step 204. In this way, flexible voltage adjustment parameters can be used to provide optimized performance.

Optionally, steps 202 and 204 are performed regularly. In this way, based on the PA nonlinearity monitoring, the PA's voltage can be dynamically adjusted and the voltage margin can be reduced as much as possible to save a remarkable amount of energy while maintaining the radio performance. It is also possible that steps 202 and 204 are performed irregularly.

The inventors have conducted two experiments to verify the effect of the solution. In the first experiment, the RRU model 4407B3 was used and the following parameters were employed:
PFM_INDICATOR_UPPER=2.4 dB,
INTERVAL_MONITOR=30 s,
VOLT_DEC_STEP=0.1V, and
VOLT_INC_STEP=1V.

The parameter PFM_INDICATOR_UPPER represents the upper limit of the acceptable correction value. When the correction value is found to be higher than this upper limit, the voltage is to be increased. The parameter INTERVAL_MONITOR represents the monitoring interval. The parameter VOLT_DEC_STEP represents the voltage decreasing step when the correction value has an enough margin. The parameter VOLT_INC_STEP represents the voltage increasing step when the correction value is found to exceed PFM_INDICATOR_UPPER. Thus, a small decreasing step (0.1V) and a relatively long monitoring interval (30 s) were used to provide more stable performance. On the other hand, a much greater increasing step (1V) was used such that radio performance can be secured in short time.

In the first experiment, the following algorithm was employed:
Step-1: Wait for a time duration of INTERVAL_MONITOR, and hold the voltage still.
Step-2: Get the current correction value, denoted as Pfm_Indicator.
Step-3: If Pfm_Indicator<PFM_INDICATOR_UPPER, go to Step-4. Else, go to Step-5.
Step-4: Reduce Vdd by the amount of VOLT_DEC_STEP. Go back to Step-1.
Step-5: Increase Vdd by the amount of VOLT_INC_STEP. Go back to Step-1.

After the above algorithm was executed for half an hour, the PA voltage was reduced from approximately 30V to 20.5V. Meanwhile, the corresponding current consumed by the PA also decreased from 1.34 A to 1.07 A, which resulted in the energy saving of 20.1%. This is a remarkably significant improvement. Although the radio performance (e.g., ACLR and EVM) was marginally influenced by the voltage decrease, the performance still well met the requirement.

In the second experiment, in order to provide more stable system performance, hysteresis was implemented to avoid frequent switching between the voltage decreasing step and the voltage increasing step. Specifically, when 2.2 dB<Pfm_Indicator<2.4 dB, the voltage was not changed until Pfm_Indicator became lower than 2.2 dB or greater than 2.4 dB again. In this way, the energy efficiency improvement dropped to 18% which is still comparable to 20.1% as in the first experiment, but the system status became much more stable.

Figure 7:
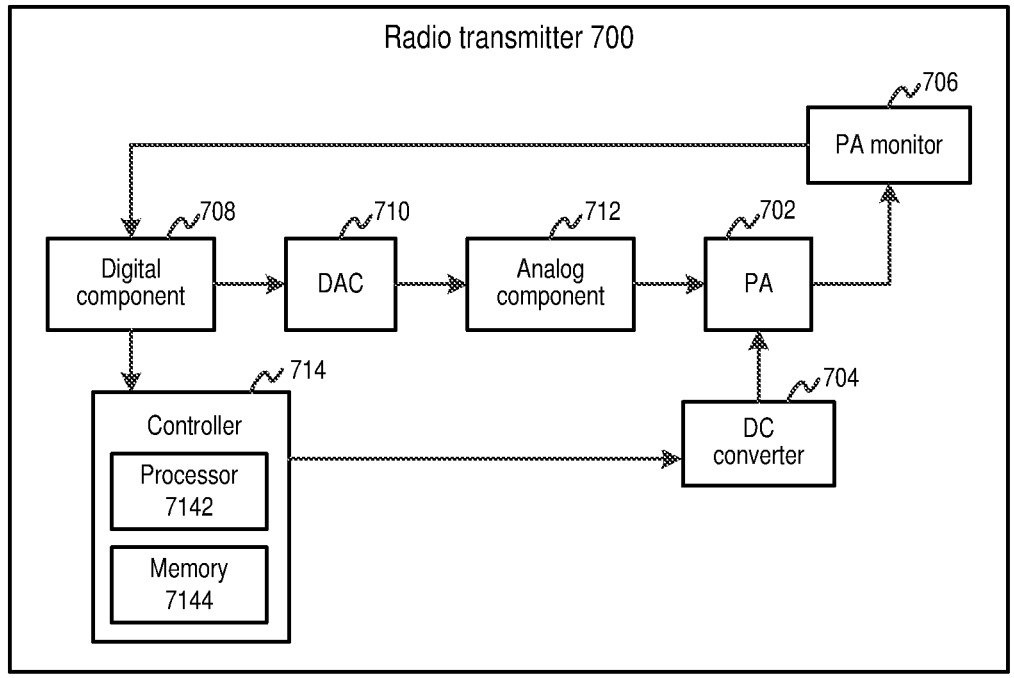
FIG. 7 is a block diagram showing a controller and a radio transmitter according to an embodiment of the disclosure.

FIG. 7 is a block diagram showing a controller and a radio transmitter according to an embodiment of the disclosure. As shown, the radio transmitter 700 comprises a PA 702, a DC converter 704, a PA monitor 706, a digital component 708, a DAC 710, an analog component 712 and a controller 714.

The DC converter 704 is configured to apply a supply voltage to the PA 702. The PA monitor 706 is configured to monitor an output from the PA 702. The PA monitor 706 may be implemented as a radio frequency (RF) feedback receiver (also referred to as an observation path receiver). For example, the RF feedback receiver may include a RF downconverting mixer, an intermediate frequency (IF) amplifier, a bandpass filter and an analog to digital converter (ADC) to generate a feedback in digital domain. The digital component 708 is configured to determine a correction value based on the feedback from the PA monitor 706 and apply the correction value to an input signal to compensate a nonlinearity of the PA 702. The digital component 708 may be implemented as a DPD circuit, as described above. The DAC 710 is configured to convert the corrected input signal to an analog signal. The analog component 712 is configured to perform up-conversion on the analog signal for subsequent amplification by the PA 702.

The controller 714 comprises a processor 7142 and a memory 7144. The memory 7144 contains instructions which may be executed by the processor 7142 to cause the controller 714 to perform the method steps described above with reference to FIGS. 2 and 4-6. As shown, the controller 714 is coupled between the digital component 708 and the DC converter 704. In this way, the controller 714 can determine the nonlinearity of the PA 702 based on the information from the digital component 708 and control the supply voltage to the PA 702 via the DC converter 704. In this way, very little additional calculation resources are required and the hardware complexity is not increased. It should be noted that the controller 714 may also be embedded in the digital component 708 or the DC converter 704.

As another embodiment, the controller may comprise a determination module and a control module. The determination module is configured to determine a nonlinearity of the PA. The control module is configured to control a supply voltage to the PA based on the determined nonlinearity.

Figure 8:
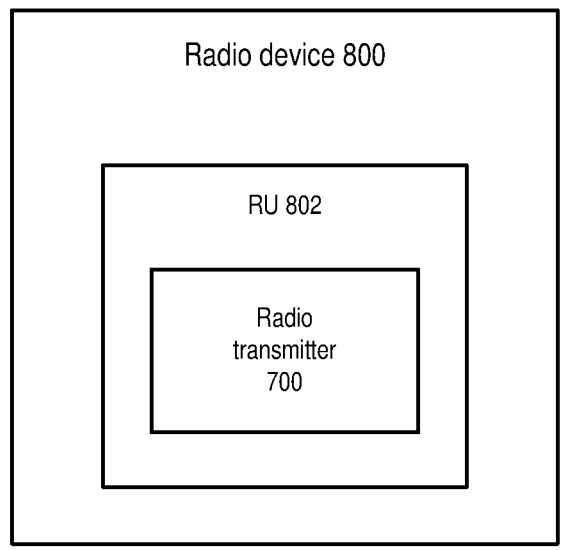
FIG. 8 is a block diagram showing a radio unit and a radio device according to an embodiment of the disclosure.

FIG. 8 is a block diagram showing a radio unit and a radio device according to an embodiment of the disclosure. As shown, the radio unit (RU) 802 comprises the radio transmitter 700 as shown in FIG. 7. The RU 802 may be a RRU for a base station. The radio device 800 comprises the RU 802. The radio device may be a base station.

However, those skilled in the art can understand that the principle of the present disclosure can also be applied to any other radio device which needs to transmit radio signals by using a PA. Therefore, the radio device 800 may also be a mobile phone or even a radar. Correspondingly, the RU 802 may be a radio unit for a mobile phone or a radar.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A method for controlling a power amplifier (PA) in a radio transmitter, comprising:
   determining a nonlinearity of the PA; and
   controlling a supply voltage to the PA based on the determined nonlinearity, wherein the step of controlling comprises:
   comparing the determined nonlinearity with a first threshold and a second threshold;
   decreasing the supply voltage in response to a comparison result that the determined nonlinearity is smaller than the first threshold;
   keeping the supply voltage unchanged in response to a comparison result that the determined nonlinearity is greater than or equal to the first threshold and smaller than the second threshold; and
   increasing the supply voltage in response to a comparison result that the determined nonlinearity is greater than or equal to the second threshold.

2. The method according to claim 1, wherein the step of controlling comprises:
   comparing the determined nonlinearity with a third and a fourth threshold, the fourth threshold being greater than the third threshold;
   once the determined nonlinearity falls below the third threshold, decreasing the supply voltage until the determined nonlinearity rises above a fifth threshold that lies between the third and fourth thresholds;
   once the determined nonlinearity rises above the fourth threshold, increasing the supply voltage until the determined nonlinearity falls below the fifth threshold; and
   when the determined nonlinearity lies between the third and fourth thresholds initially or after the step of decreasing or increasing, keeping the supply voltage unchanged.

3. The method according to claim 1, wherein an increasing amount of the supply voltage in the step of increasing is greater than or equal to a decreasing amount of the supply voltage in the step of decreasing.

4. The method according to claim 1, wherein the step of controlling is performed with different control parameters for different radio carrier setups.

5. The method according to claim 1, wherein the nonlinearity is indicated by at least one of:
   a correction value that is applied by a digital component in the radio transmitter to an input signal to compensate the nonlinearity; and
   an error vector magnitude (EVM) or an amplitude-amplitude (AM-AM) characteristic between the input signal and an output signal of the digital component.

6. The method according to claim 1, wherein the steps of determining and controlling are performed regularly or irregularly.

7. A controller for controlling a power amplifier (PA) in a radio transmitter, comprising:
   a processor; and a memory, the memory containing instructions executable by the processor, whereby the controller is operative to:
   determine a nonlinearity of the PA; and
   control a supply voltage to the PA based on the determined nonlinearity, where the instructions are executable by the processor, whereby the controller is operative to perform the step of controlling by:
   comparing the determined nonlinearity with a first threshold and a second threshold;
   decreasing the supply voltage in response to a comparison result that the determined nonlinearity is smaller than the first threshold;
   keeping the supply voltage unchanged in response to a comparison result that the determined nonlinearity is greater than or equal to the first threshold and smaller than the second threshold; and
   increasing the supply voltage in response to a comparison result that the determined nonlinearity is greater than or equal to the second threshold.

8. The controller according to claim 7, wherein the instructions are executable by the processor, whereby the controller is operative to perform the step of controlling by:
   comparing the determined nonlinearity with a third and a fourth threshold, the fourth threshold being greater than the third threshold;
   once the determined nonlinearity falls below the third threshold, decreasing the supply voltage until the determined nonlinearity rises above a fifth threshold that lies between the third and fourth thresholds;
   once the determined nonlinearity rises above the fourth threshold, increasing the supply voltage until the determined nonlinearity falls below the fifth threshold; and
   when the determined nonlinearity lies between the third and fourth thresholds initially or after the step of decreasing or increasing, keeping the supply voltage unchanged.

9. The controller according to claim 7, wherein an increasing amount of the supply voltage in the step of increasing is greater than or equal to a decreasing amount of the supply voltage in the step of decreasing.

10. The controller according to claim 7, the instructions are executable by the processor, whereby the controller is operative to perform the step of controlling with different control parameters for different radio carrier setups.

11. The controller according to claim 7, wherein the nonlinearity is indicated by at least one of:
   a correction value that is applied by a digital component in the radio transmitter to an input signal to compensate the nonlinearity; and
   an error vector magnitude (EVM) or an amplitude-amplitude (AM-AM) characteristic between the input signal and an output signal of the digital component.

12. The controller according to claim 7, wherein the instructions are executable by the processor, whereby the controller is operative to perform the steps of determining and controlling regularly or irregularly.

13. A radio transmitter comprising:
   a power amplifier (PA);
   a direct current (DC) converter configured to apply a supply voltage to the PA;
   a PA monitor configured to monitor an output from the PA;
   a digital component configured to determine a correction value based on a feedback from the PA monitor and apply the correction value to an input signal to compensate for a nonlinearity of the PA;
   a digital to analog converter (DAC) configured to convert the corrected input signal to an analog signal;
   an analog component configured to perform up-conversion on the analog signal for subsequent amplification by the PA; and
   a controller configured to:
      determine the nonlinearity of the PA; and
      control the supply voltage to the PA based on the determined nonlinearity, where the controller is configured to perform the step of controlling by being configured to:
      compare the determined nonlinearity with a first threshold and a second threshold;
      decrease the supply voltage in response to a comparison result that the determined nonlinearity is smaller than the first threshold;
      keep the supply voltage unchanged in response to a comparison result that the determined nonlinearity is greater than or equal to the first threshold and smaller than the second threshold; and
      increase the supply voltage in response to a comparison result that the determined nonlinearity is greater than or equal to the second threshold.

* * * * *

UNITED STATES PATENT AND TRADEMARK OFFICE
CERTIFICATE OF CORRECTION

| | |
|---|---|
| PATENT NO. | : 11,082,073 B2 |
| APPLICATION NO. | : 16/500169 |
| DATED | : August 3, 2021 |
| INVENTOR(S) | : Zhang et al. |

It is certified that error appears in the above-identified patent and that said Letters Patent is hereby corrected as shown below:

In the Specification

In Column 1, below Title, insert -- This application is a 35 U.S.C. § 371 national phase filing of International Application No. PCT/CN2017/087163, filed June 5, 2017, the disclosure of which is incorporated herein by reference in its entirety. --.

Signed and Sealed this
Tenth Day of May, 2022

Katherine Kelly Vidal
*Director of the United States Patent and Trademark Office*